(12) United States Patent
Li et al.

(10) Patent No.: US 8,680,614 B2
(45) Date of Patent: Mar. 25, 2014

(54) SPLIT TRENCH-GATE MOSFET WITH INTEGRATED SCHOTTKY DIODE

(75) Inventors: Tiesheng Li, San Jose, CA (US); Rongyao Ma, Chengdu (CN); Lei Zhang, Chengdu (CN)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 13/494,572

(22) Filed: Jun. 12, 2012

(65) Prior Publication Data

US 2013/0328122 A1 Dec. 12, 2013

(51) Int. Cl.
*H01L 29/66* (2006.01)

(52) U.S. Cl.
USPC ........... 257/334; 257/217; 257/288; 438/167; 438/197

(58) Field of Classification Search
USPC .......................................... 257/334
See application file for complete search history.

(56) References Cited

U.S. PATENT DOCUMENTS

| | | | |
|---|---|---|---|
| 6,316,806 B1 * | 11/2001 | Mo | 257/330 |
| 6,465,836 B2 | 10/2002 | Lin et al. | |
| 7,504,676 B2 | 3/2009 | Bhalla et al. | |
| 7,977,742 B1 | 7/2011 | Disney | |
| 2008/0197407 A1 * | 8/2008 | Challa et al. | 257/330 |
| 2011/0233659 A1 * | 9/2011 | Tai | 257/330 |

OTHER PUBLICATIONS

U.S. Appl. No. 13/462,379, Zhang et al.

* cited by examiner

*Primary Examiner* — Thao Le
*Assistant Examiner* — Laura Dykes
(74) *Attorney, Agent, or Firm* — Perkins Coie LLP

(57) ABSTRACT

A split trench-gate MOSFET device and method for forming this device is disclosed. The device has a trench gate structure, comprising a shield electrode and two gate electrodes, wherein a substantial portion of shield electrode region is lower than the gate electrode region, and wherein a portion of the shield electrode region extends to the top surface between the two gate electrodes. The device further comprises a source metal layer, contacting to an initial layer, a well region, the shield electrode and a source region at the top surface, wherein the contact between the source metal layer and the initial layer forms a Schottky diode.

22 Claims, 15 Drawing Sheets

SPLIT TRENCH-GATE MOSFET WITH INTEGRATED SCHOTTKY DIODE

TECHNICAL FIELD

The present invention generally relates to semiconductor device, and more particularly but not exclusively relates to semiconductor power device.

BACKGROUND

As the continuous development of electronic technology, inverting amplifier circuits are now widely applied in electronic apparatus. Usually, these inverting amplifier circuits suffer from the Miller effect. Miller effect refers to the equivalent input capacitance of an inverting amplifier. When there is capacitance between the input end and the output end, due to the amplifying effect of the amplifier, the equivalent input capacitance will be enlarged by a factor of 1+Av wherein Av is the gain of the amplifier. This effect deteriorates the frequency performance of the amplifier.

To alleviate the Miller effect, split trench-gate metal oxide semiconductor field effect transistors (MOSFET) are designed. As shown in FIG. 1, a split trench-gate MOSFET 10 conventionally comprises two electrodes in a gate structure. A first electrode serves as the MOSFET gate electrode 101 to control the channel formation of the MOSFET, and a second electrode serves as shield electrode 102 to decrease the capacitance Cgd between drain electrode 103 and gate electrode 101. However, since the shield electrode 102 conventionally extends to surface and is further coupled to a pick-up structure 110 at a terminal region which is located at sides of MOSFET 10, it may need a relative large area to form the metal contact and pick up. Thus MOSFET 10 may cost too much die size. Meanwhile the shield electrode 102 may also generate a relative large series resistance, which limits the safe operating area (SOA) of the MOSFET.

SUMMARY

One embodiment of the present invention discloses a new type split trench-gate MOSFET device. The split trench-gate MOSFET device comprises a semiconductor initial layer with a first conductivity type; a well region with second conductivity type formed in a portion of the initial layer, wherein other portion of the initial layer is exposed at the top surface of the device; a split trench-gate structure, comprising a shield electrode and two gate electrodes, wherein a substantial portion of shield electrode is beneath the two gate electrodes, and wherein the other portion of shield electrode extends to the top surface of the device and is between the two gate electrodes; a source region, formed in the well region, wherein one side of the source region is against the side wall of the trench gate structure, and wherein the source region has the first conductivity type; and a source metal layer, contacting the initial layer, the well region, the shield electrode and the source region at the top surface, wherein a contact between the source metal layer and the initial layer at the top surface forms a Schottky diode.

BRIEF DESCRIPTION OF THE DRAWINGS

Non-limiting and non-exhaustive embodiments are described with reference to the following drawings. The drawings are only for illustration purpose. These drawings are not necessarily drawn to scale. The relative sizes of elements illustrated by the drawings may differ from the relative size depicted.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present technology may be practiced without these specific details. In other instances, well-known methods, procedures, components, and circuits have not been described in detail so as not to unnecessarily obscure aspects of the present invention.

One of ordinary skill in relative art should further understand that certain conductivity types of the semiconductor materials described in the following text are for the interpretation of certain embodiments. However, alternative conductivity types of the semiconductor materials may also apply according to other embodiments of the present technology.

The "+" and "−" in the following text is to describe the relative doping concentration of certain areas. However, it does not intend to limit the absolute doping range or other aspects of these areas. For example, a doping area described as n+ or n− may also be described as n-type doping area alternatively.

Figure 2:
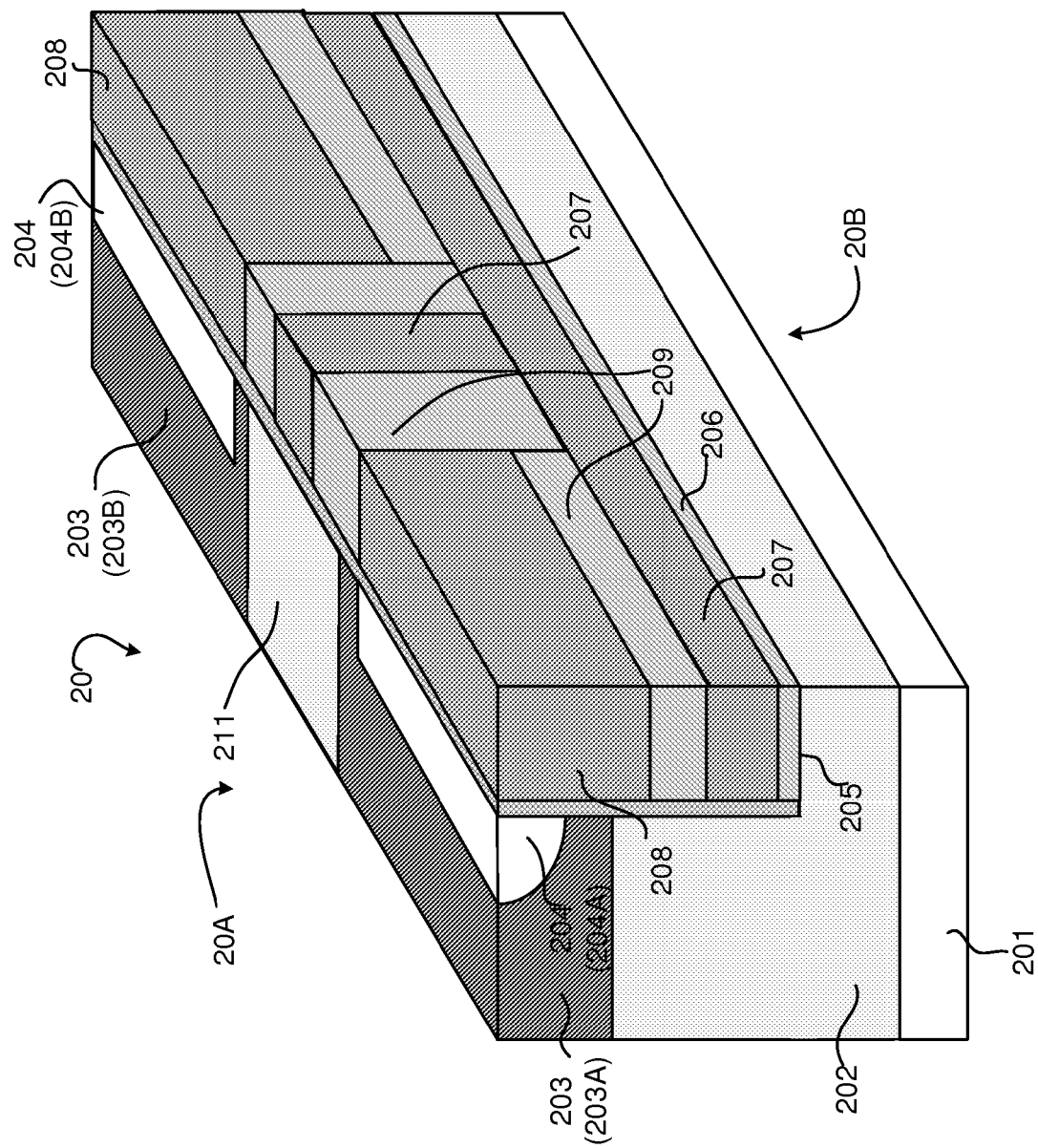
FIG. 2 illustrates a schematic three-dimensional view of a split trench-gate MOSFET 20 integrating with Schottky diode according to an embodiment of the present invention.

FIG. 2 illustrates a schematic three-dimensional view of a split trench-gate MOSFET 20 integrating with a Schottky diode according to an embodiment of the present invention. The split trench-gate MOSFET 20 comprises an initial layer. In the illustrated embodiment shown in FIG. 2, the initial layer comprises a semiconductor substrate 201 at a bottom surface 20B as the drain region and also an N-type semiconductor epitaxy layer 202 formed on the substrate 201. In another embodiment, the initial layer may only comprise just a semiconductor substrate 201. A P-type well region (P-well) 203 is formed in part of the initial layer as a body region of the trench-gate MOSFET 20. In the illustrated embodiment, the P-well region comprises two portions 203A and 203B. In other embodiments, the P-well region may further comprise more than two P-well region portions. A portion of initial layer extends to a top surface 20A of split trench-gate MOSFET 20 and is between the two P-well regions portions 203A and 203B. This portion of initial layer at the top surface 20A of the semiconductor device is defined as Schottky contact area 211. A trench 205 stretches through P-well region 203 and into epitaxy layer 202. In another embodiment, trench 205 may further stretch through epitaxy layer 202 and into semiconductor substrate 201. An N+ source region 204 is formed in the P-well region 203 proximate trench 205. The term "proximate" hereby means that one side of source region 204 is against the side wall of trench 205. In the illustrated embodiment, N+ source region 204 comprises two portions 204A and 204B which are disposed in each of the P-well region portions respectively. In other embodiments, N+ source region 204 may comprise different number of portions or different arrangement.

Continuing with FIG. 2, the side wall and the bottom of trench 205 are covered with a first insulation material layer 206. In one embodiment, first insulation material layer 206 may comprise silicon oxide. In other embodiments, other suitable insulation materials may be applied. Two types of electrodes are formed in trench 205, wherein a first type of electrode is defined as shield electrode 207, and wherein a second type of electrode is defined as gate electrode 208. In the illustrated embodiment, there are two gate electrodes 208. Shield electrode 207 and the two gate electrodes 208 are isolated from each other by a second insulation material layer 209. One feature of the present invention is that a substantial portion of shield electrode 207 is beneath the two gate electrodes 208, while the other portion of shield electrode structure 207 vertically extends to the top surface 20A between the two gate electrodes 208. For forming the channel of MOSFET 20, the two gate electrodes 208 are formed deeper than P-well region 203. In one embodiment, shield electrode 207 and gate electrode 208 comprise poly-silicon. In other embodiments, other suitable material may be applied to form shield electrode 207 and gate electrode 208. In one embodiment, a trench gate structure may comprise trench 205, first insulation material layer 206, shield electrode 207 gate electrode 208 and second insulation material layer 209.

Figure 3:
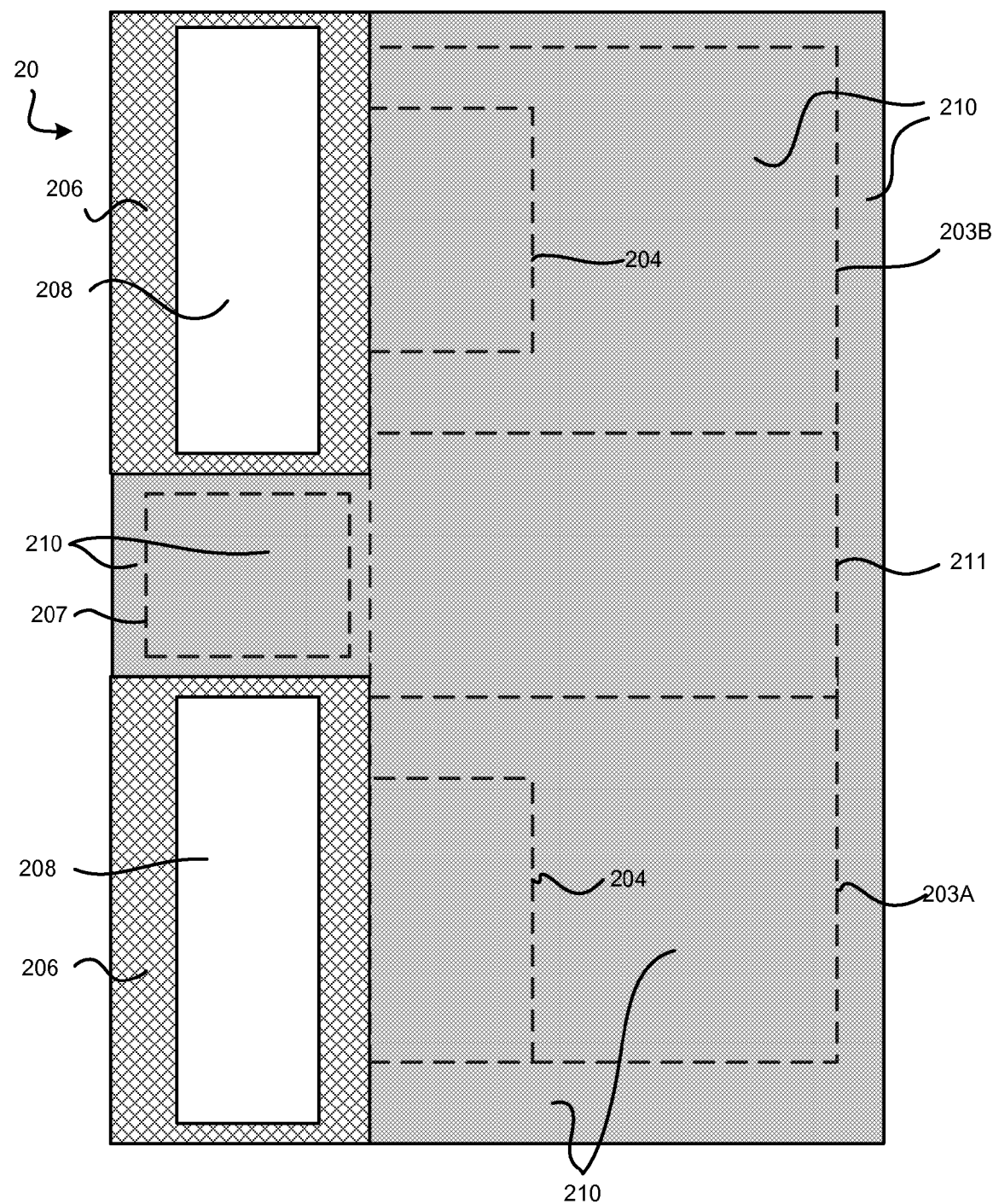
FIG. 3 illustrates a schematic layout diagram of a split trench-gate MOSFET 20 integrating with Schottky diode according to an embodiment of the present invention.

FIG. 3 illustrates a schematic layout diagram of the split trench-gate MOSFET 20 integrating with Schottky diode according to an embodiment of the present invention. As shown in FIG. 3, MOSFET 20 further comprises a source metal layer 210 formed on the top surface 20A. The gray region in FIG. 3 identifies source metal layer 210. Source metal layer 210 contacts with P-well region 203, N+ source region 204 and a portion of shield electrode 207 (the dash line regions shown in FIG. 3) at the top surface 20A. Moreover, source metal layer 210 contacts to Schottky contact area 211 (in dash line) to form an integrated Sckottky diode. Thus an integrated Schottky diode 21 is formed coupled between the source and the drain of MOSFET 20 configured to improve the reverse recovery characteristic performance of the device. In additional, it may take full advantages of no-channel area which may be partially caused by shield electrode 207 at the top surface 20A. In the illustrated embodiment, source metal layer 210 fully contacts to shield electrode structure 207, P-well region 203, N+ source region 204 and Schottky contact area 211. The term "fully" hereby and in the following text represents that source metal layer 210 contacts to the above sections with all its area. In another embodiment, source metal layer 210 may be connected to shield electrode structure 207, P-well region 203, N+ source region 204 and Schottky contact area 211 through via or other suitable method. Seen in FIG. 3, the full contact between shield electrode 207 and source metal layer 210 is disposed at center area of the MOSFET 20 instead of side area in the prior art MOSFET 10 shown in FIG. 1, and consequently the shield electrode 207 has a relatively small size. As a result, the shield electrode series resistance is reduced, which may be helpful to maintain the same voltage potential along the whole shield electrode 207. Further the MOSFET's safe operating area (SOA) may be improved and the shielding effect of shield electrode 207 may be enhanced.

Figure 4:
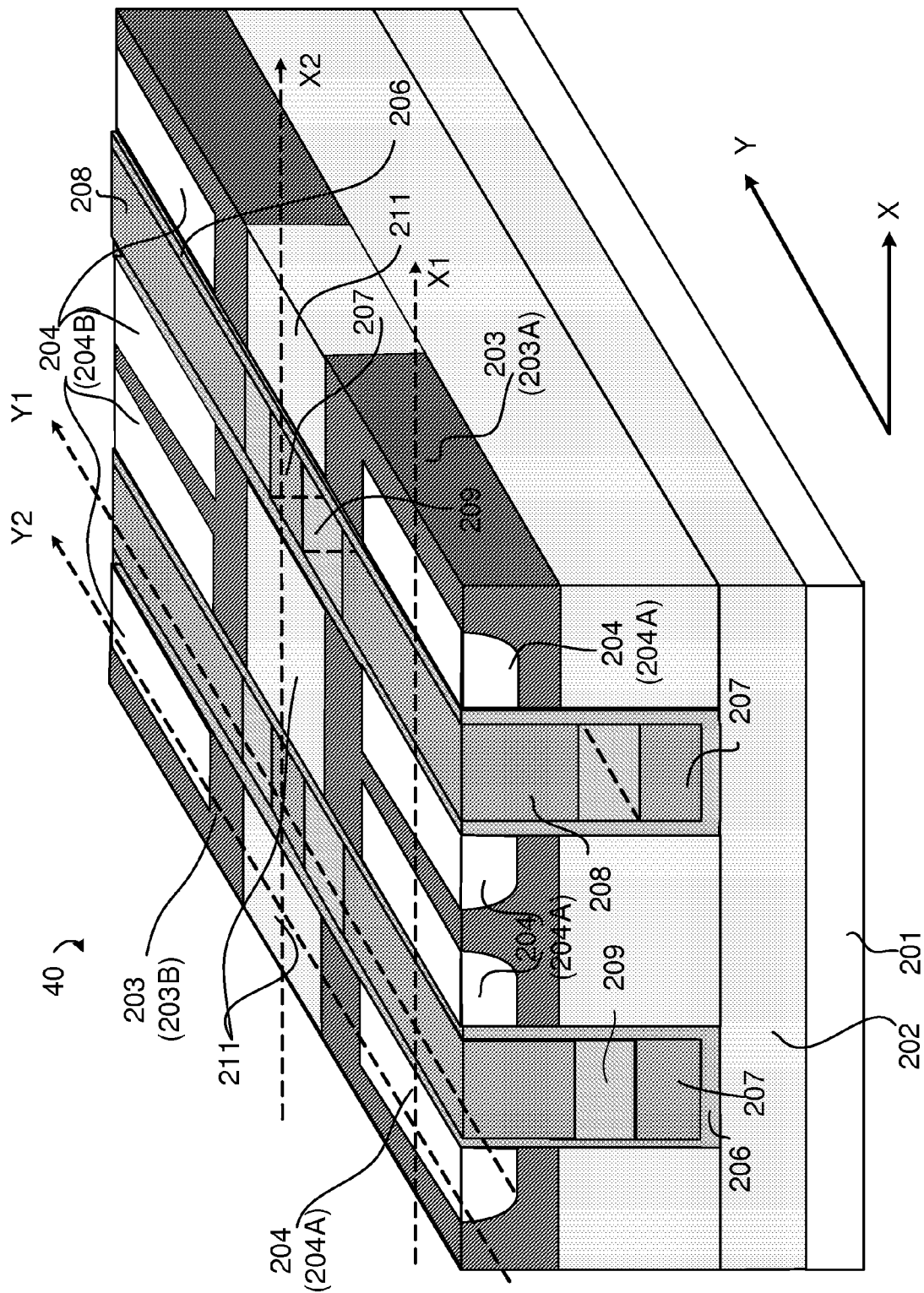
FIG. 4 illustrates a schematic three-dimensional view of a split trench-gate MOSFET 40 with a continuous structure according to an embodiment of the present invention.

FIG. 4 illustrates a schematic three-dimensional view of a split trench-gate MOSFET 40 with a continuous structure according to an embodiment of the present invention. As illustrated, compared with split trench-gate MOSFET 20, split trench-gate MOSFET 40 comprises a continuous structure. This continuous structure is duplicated along an extending orientation X which is perpendicular to the trench gate structure in horizontal plane. Along the extending orientation, each of trench gate structure is disposed between two adjacent P-well regions 203, while each of P-well regions 203 is disposed between two adjacent trench gate structures. In certain embodiments, N+ source regions 204 are further disposed at both sides of the trench gate structure along the extending orientation. In one embodiment, N+ source regions 204 may be enclosed by P-well region 203, wherein N+ source region portion 204A is in P-well region portion 203A, and wherein N+ source region portion 204B is in P-well region portion 203B. However in other embodiments, N+ source regions 204 may have other suitable shape or arrangement.

Figure 1:
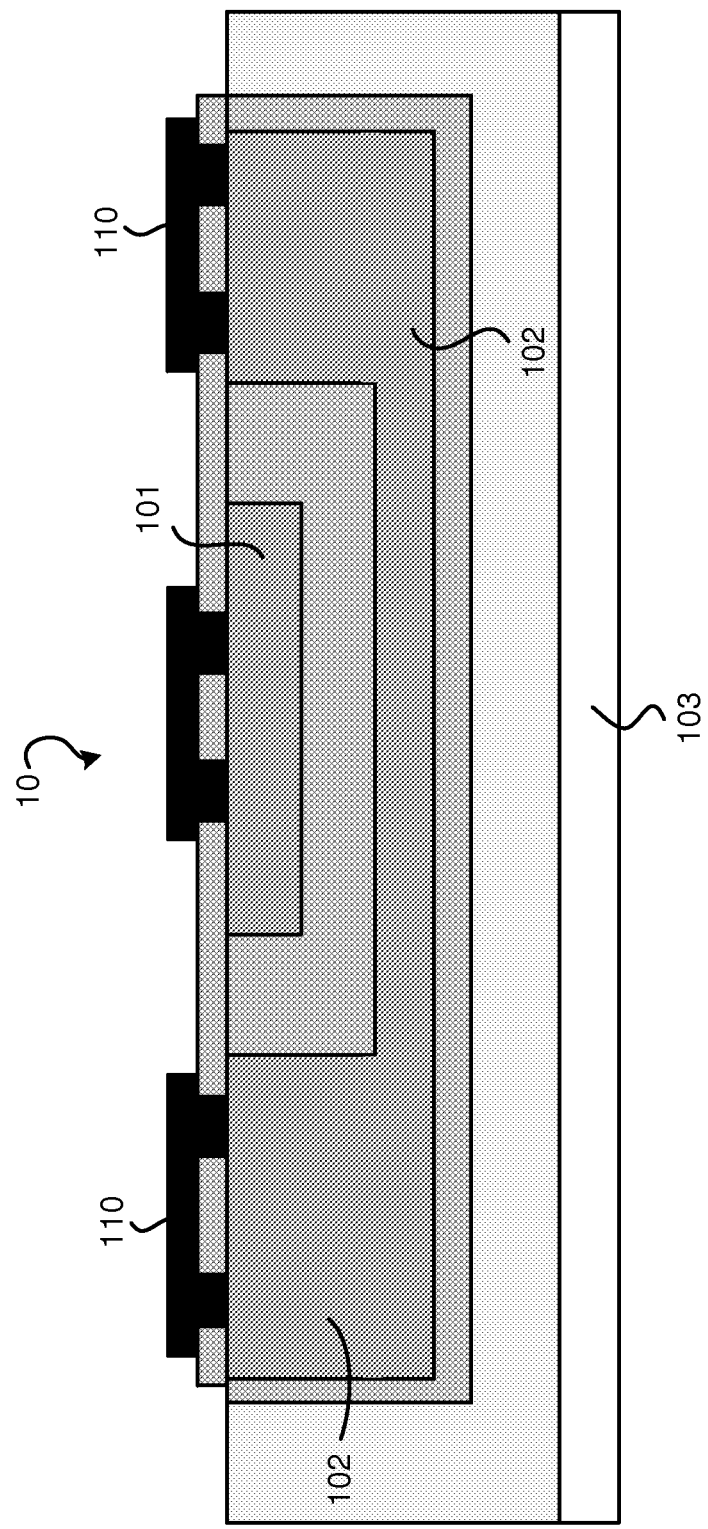
FIG. 1 illustrates a schematic cross-sectional view of a prior art split trench-gate MOSFET.
Figure 5:
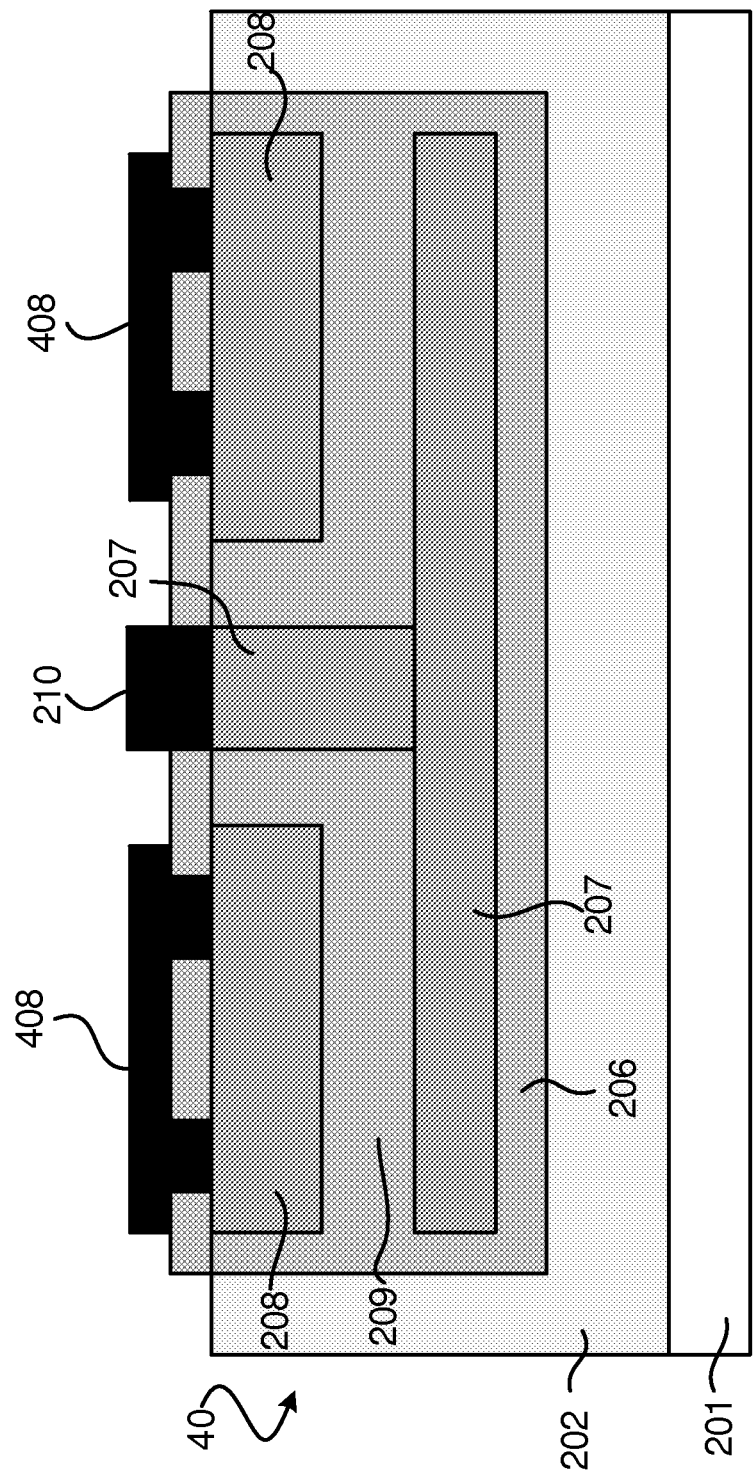
FIG. 5 illustrates a cross-sectional view of the split trench-gate MOSFET 40 along an axis Y1 according to an embodiment of the present invention.

FIG. 5 illustrates a cross-sectional view of the split trench-gate MOSFET 40 integrated with the Schottky diode along an axis Y1 according to an embodiment of the present invention. Seen in FIG. 5, the two gate electrodes 208 are further connected to gate electrode pick-ups 408, whereas a portion of the shield electrode 207 stretches to the top surface of the device and fully contacts to source metal layer 210. The vertically stretched portion of shield electrode 207 is between two gate electrodes 208 in the center. The second isolation material layer 209 isolates shield electrode 207 and two gate electrodes 208 from each other. Due to the full contact between shield electrode 207 and source metal layer 210, the shield electrode pick-up 110 as shown in FIG. 1 is wiped off at the presented embodiment and therefore the die size cost could be reduced.

Figure 6:
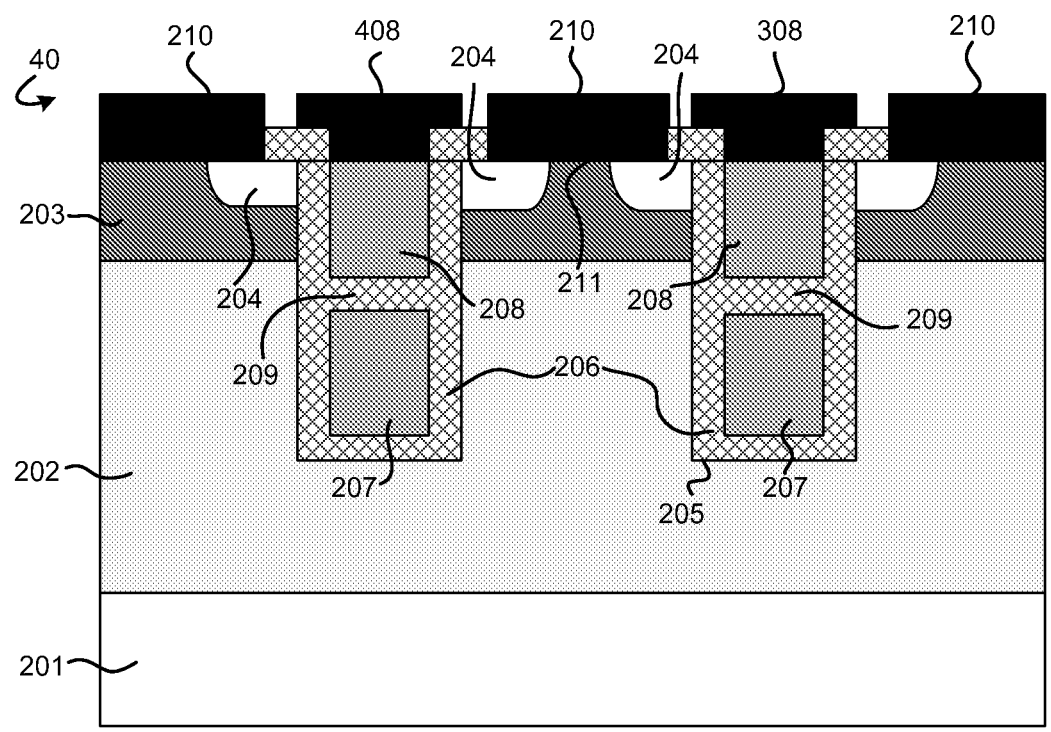
FIG. 6 illustrates a cross-sectional view of the split trench-gate MOSFET 40 along an axis X1 according to an embodiment of the present invention.

FIG. 6 illustrates a cross-sectional view of the split trench-gate MOSFET 40 integrated with Schottky diode along axis X1 according to an embodiment of the present invention. As shown in FIG. 6, split trench-gate MOSFET 40 comprises is continuously structural. Each of the trench structures is disposed between two adjacent source regions 204. Along axis X1, trench 205, first insulation material layer 206, shield electrodes 207 gate electrode 208 and second insulation material layer 209 comprise the split-gate structure in trench 205. Gate electrode 208 is formed deeper than P-well region 203 configured to control the channel formation of MOSFET 40. Second insulation material layer 209 isolates shield electrode 207 and gate electrode 208. Source metal layer 210 fully contacts to source region 204 and P-well 203, whereas pickup structure 408 is formed on gate electrode 208.

Figure 7:
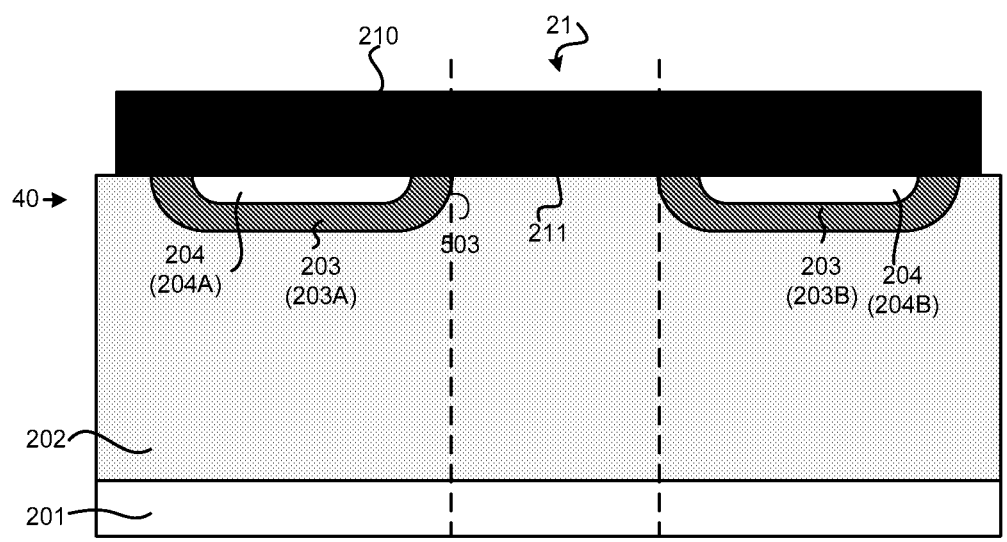
FIG. 7 illustrates a cross-sectional view of the split trench-gate MOSFET 40 along an axis Y2 according to an embodiment of the present invention.

FIG. 7 illustrates a cross-sectional view of the split trench-gate MOSFET 40 integrated with Schottky diode along axis Y2 according to an embodiment of the present invention. For continuously structural split trench-gate MOSFET 40, source region portions 204A and 204B are respectively enclosed by P-well region portions 203A and 203B along axis Y2. Source metal layer 210 fully contacts to P-well region 203, source region 204 and Schottky contact area 211. As shown in FIG. 7, a portion of source metal layer 210 which fully contacts Schottky contact area 211 at top surface 20A serves as the anode of Schottky diode 21 and the corresponding bottom part of semiconductor substrate 201 at bottom surface 20B serves as the cathode of Schottky diode 21. Each of the Schottky diodes 21 is disposed between two adjacent P-well region portions 203A and 203B along Y axis. In certain embodiments, P-well region portions 203A and 203B may abuts to Schottky contact area 211, and the edge parts 503 of P-well region portions 203A and 203B may be curved. By properly adjusting the distance of two adjacent P-well regions portions 203A and 203B, the electric field distortion near the edge of Schottky contact area 211 may be alleviated when the Schottky diode 21 is negative biased. Therefore the integrated Schottky diode 21 may have a characteristic of improved break down voltage and lower leakage current due to the shielding effect of edge parts 503.

Figure 8:
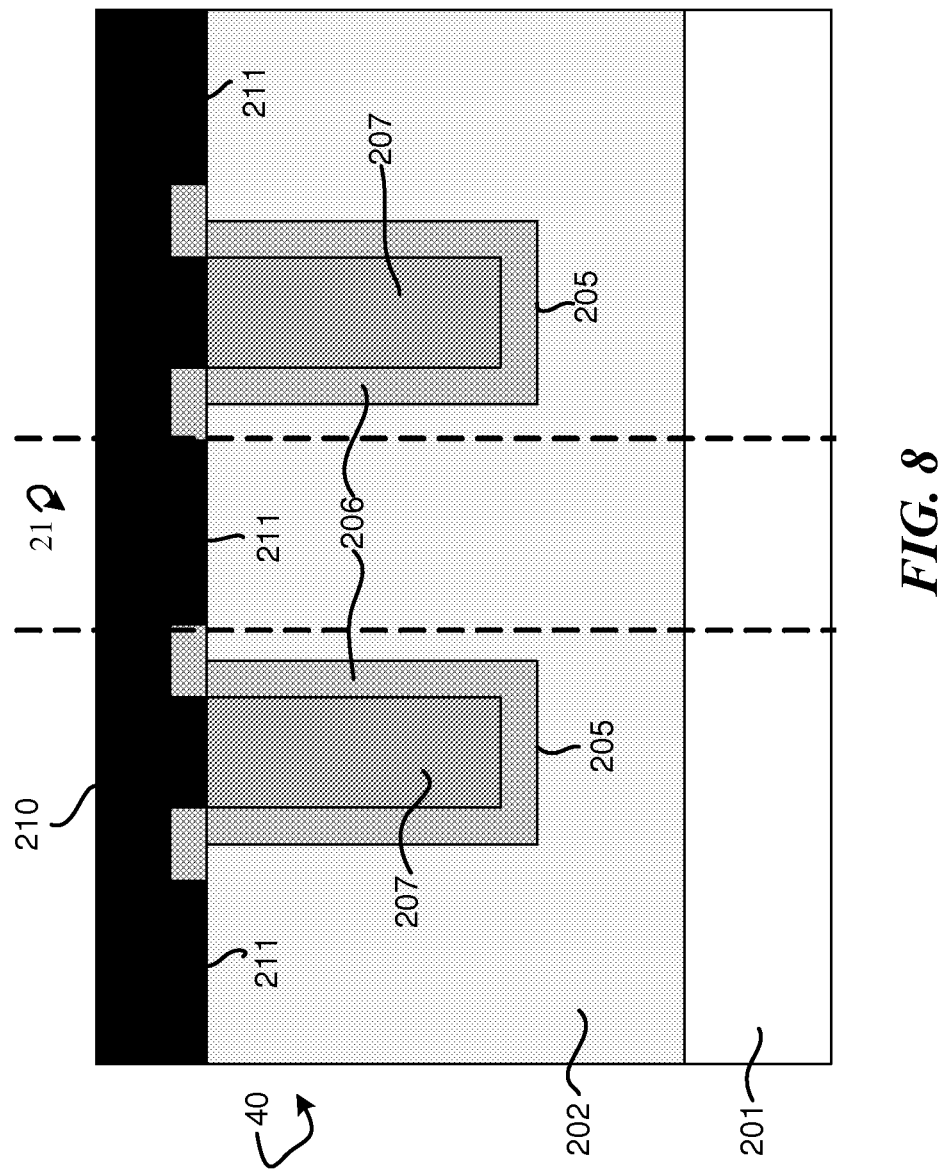
FIG. 8 illustrates a cross-sectional view of the split trench-gate MOSFET 40 along an axis X2 according to an embodiment of the present invention.

FIG. 8 illustrates a cross-sectional view of the split trench-gate MOSFET 40 integrated with the Sckottky diode 21 along an axis X2 according to an embodiment of the present invention. As shown in FIG. 8, trench-gate MOSFET 40 is continuously structural. Along axis X2, the Schottky diode 21 is disposed between two adjacent trench structures. In the illustrated embodiment, along axis X2, each of the gate structure is not split. Shield electrode 207 extends to the top surface 20A of configured to make a full and direct contact with source metal layer 210. In certain embodiments, the flowing current path of Schottky diode 21 is restricted between two adjacent trench structures 205 along X2 axis. In additional, trench 205 may pinch off Schottky diode 21 with a relatively low drain voltage, which may further improve the breakdown voltage or enable a relatively large Schottky contact area 211.

It should be noted that the semiconductor device according to some embodiments of the present invention may not comprises all of features described above. One with ordinary skill in relevant art should further understand that the above descriptions and specifications are for the purpose of illustration. However, in other embodiments, certain components may have different shape, arrangement, or connection relationships.

FIGS. 9A-9G illustrate a fabrication process flow of forming the split trench-gate MOSFET 40 integrating with Schottky diode according to an embodiment of the present invention. In the illustrated embodiment, the split trench-gate MOSFET 40 integrating with Schottky diode comprises a continuous structure that duplicated along the extending orientation. Hereby, the structure of split trench-gate MOSFET 40 is simplified for better understanding. One with ordinary skill in relevant art should understand that the fabrication process flow shown in the follow text could also be applied for forming the split trench-gate MOSFET 20 which has a non-continuous structure.

Figure 9A:
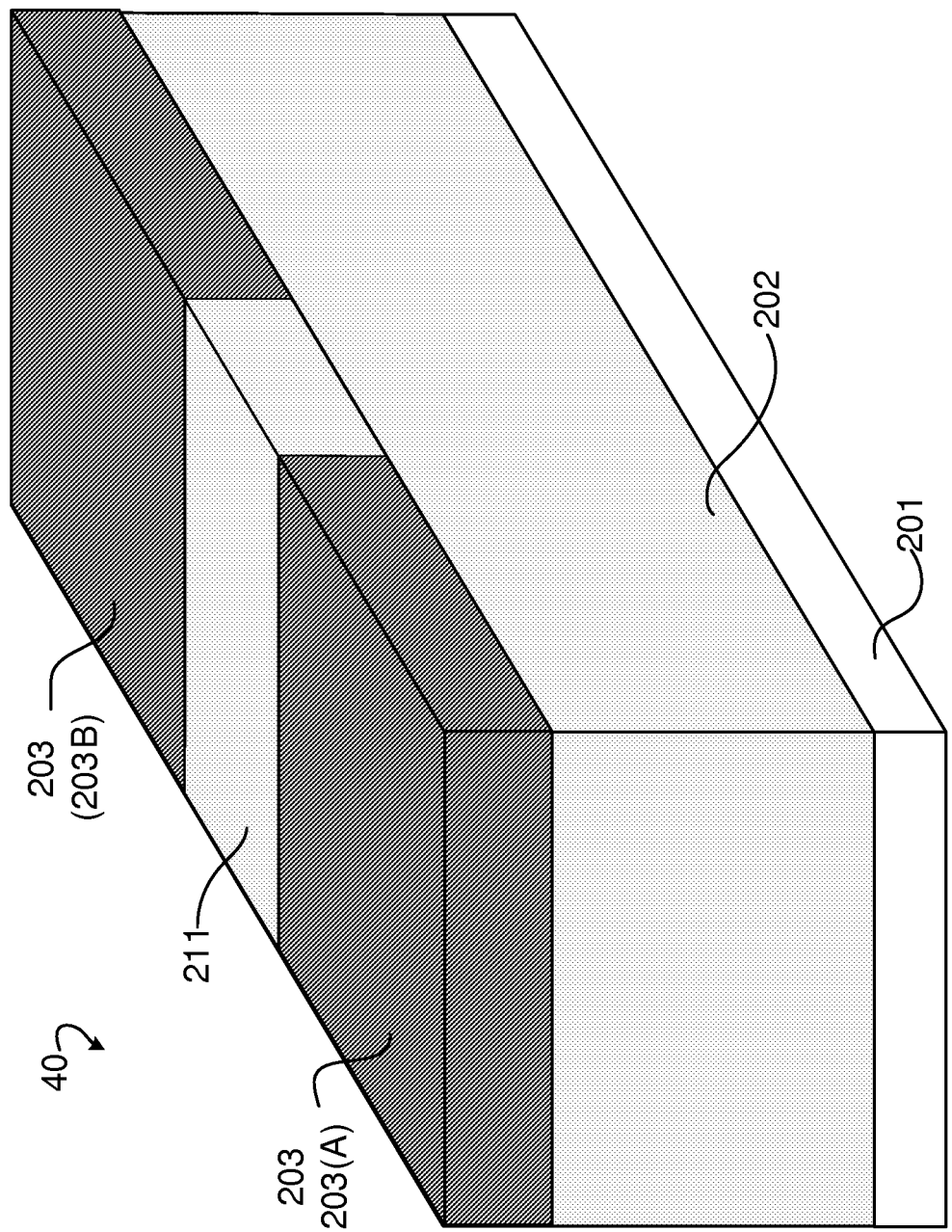
FIGS. 9A-9G illustrate a fabrication process flow of forming the split trench-gate MOSFET 40 according to an embodiment of the present invention.
Figure 9B:
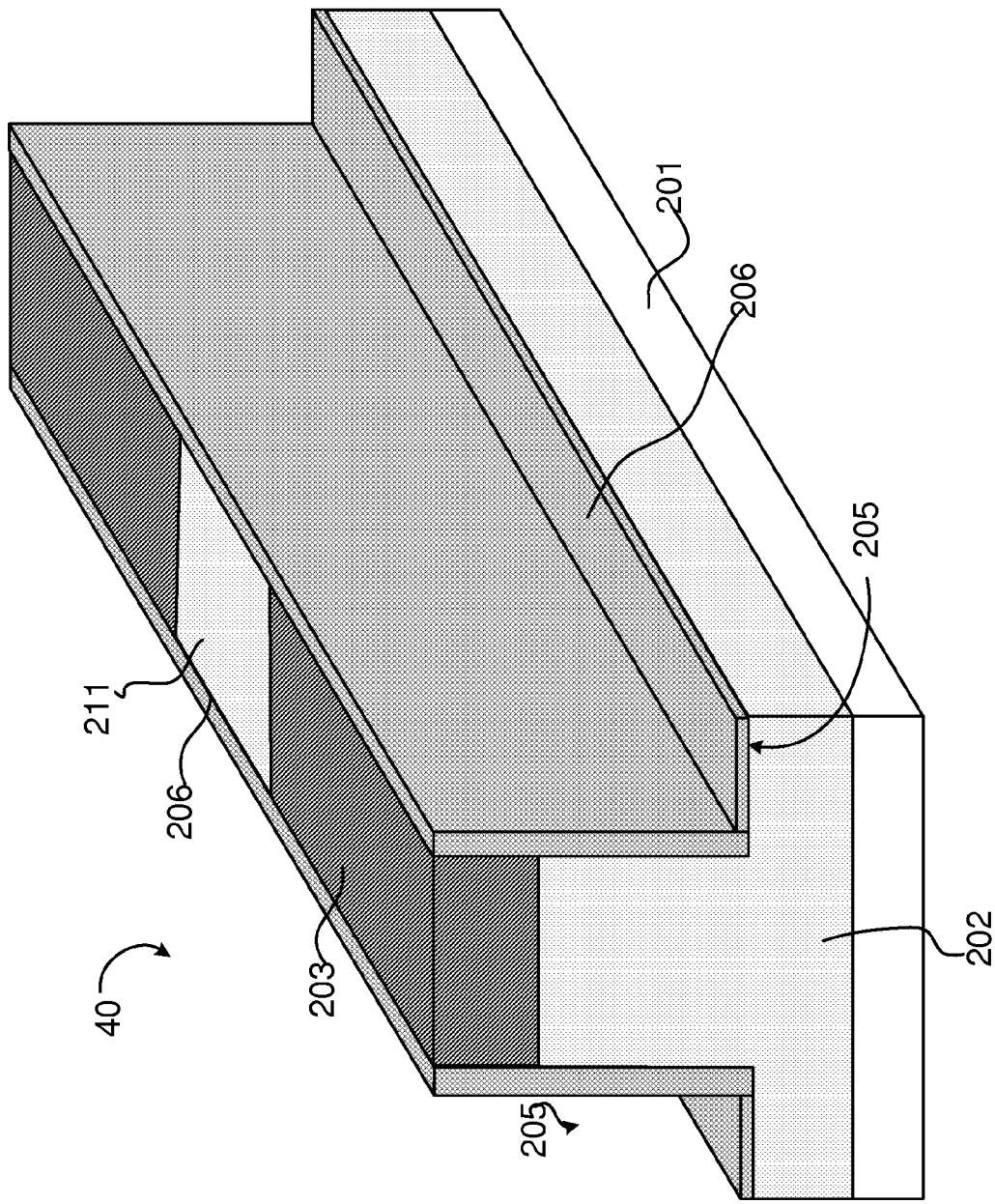

Seen in FIG. 9A, in the illustrated embodiment, an N-type epitaxy layer 202 is formed on an N-type semiconductor substrate 201 as initial layer. P-well regions 203 are formed on the initial layer and isolated from each other at the top surface 20A. The initial layer area at the top surface is defined as Schottky contact area 211. In one embodiment, P-well regions 203 may be formed by selective ion implantation. In other embodiments, P-well region 203 may also be formed through diffusion or other suitable method.

Referring to FIGS. 9B-9E, split trench-gate structures is formed and stretches through the P-well region and into the initial layer. As shown in FIG. 7B, trenches 205 are etched and stretch into the initial layer. Then an insulation material layer may be deposited on the side wall and bottom of trenches 205 to form first insulation layer 206. The insulation material layer may comprise silicon oxide, silicon nitride or other suitable materials. Chemical vapor deposition (CVD), thermal oxidation or other suitable method may be utilized to deposit the first insulation layer 206.

Figure 9C:
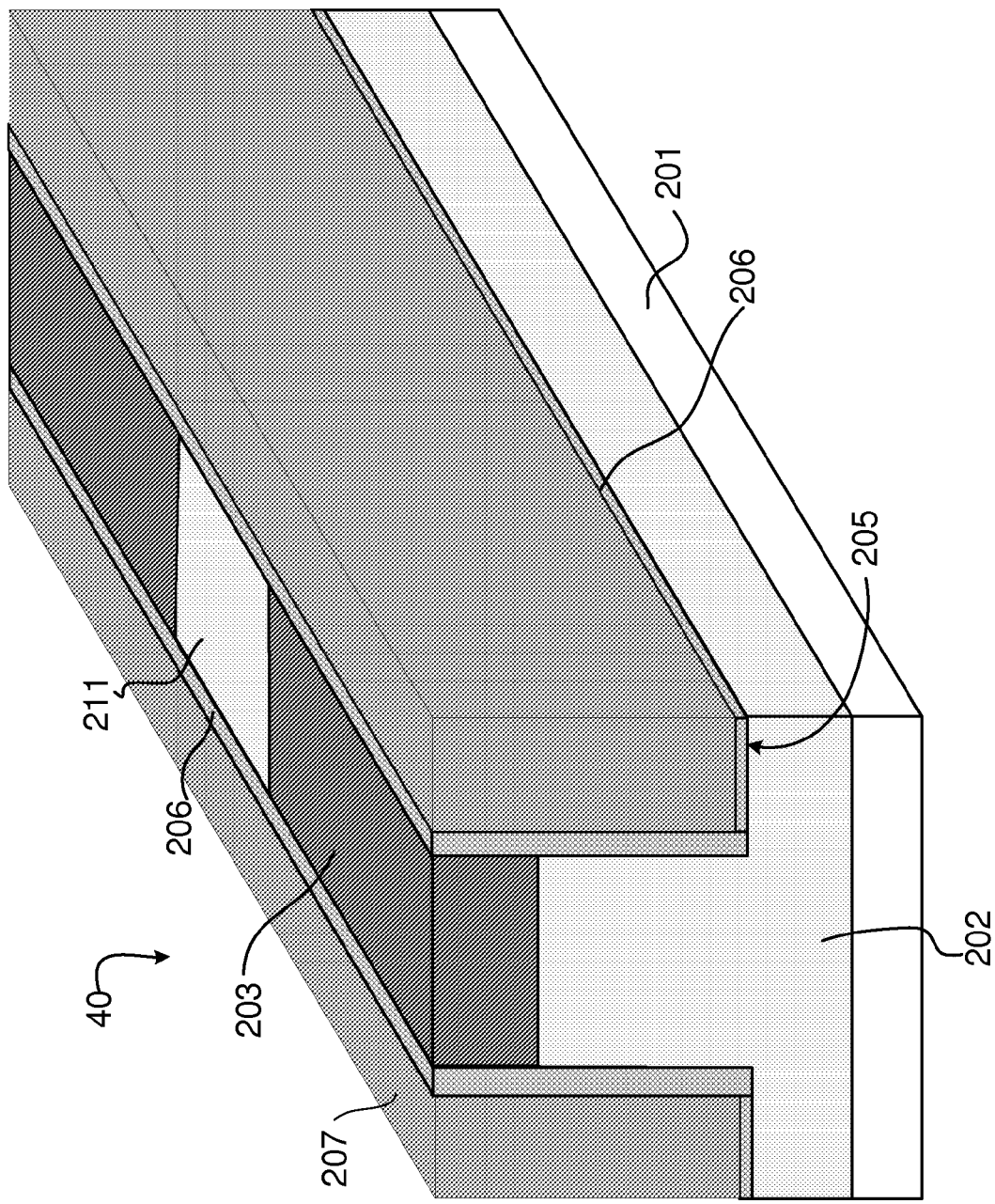
Figure 9D:
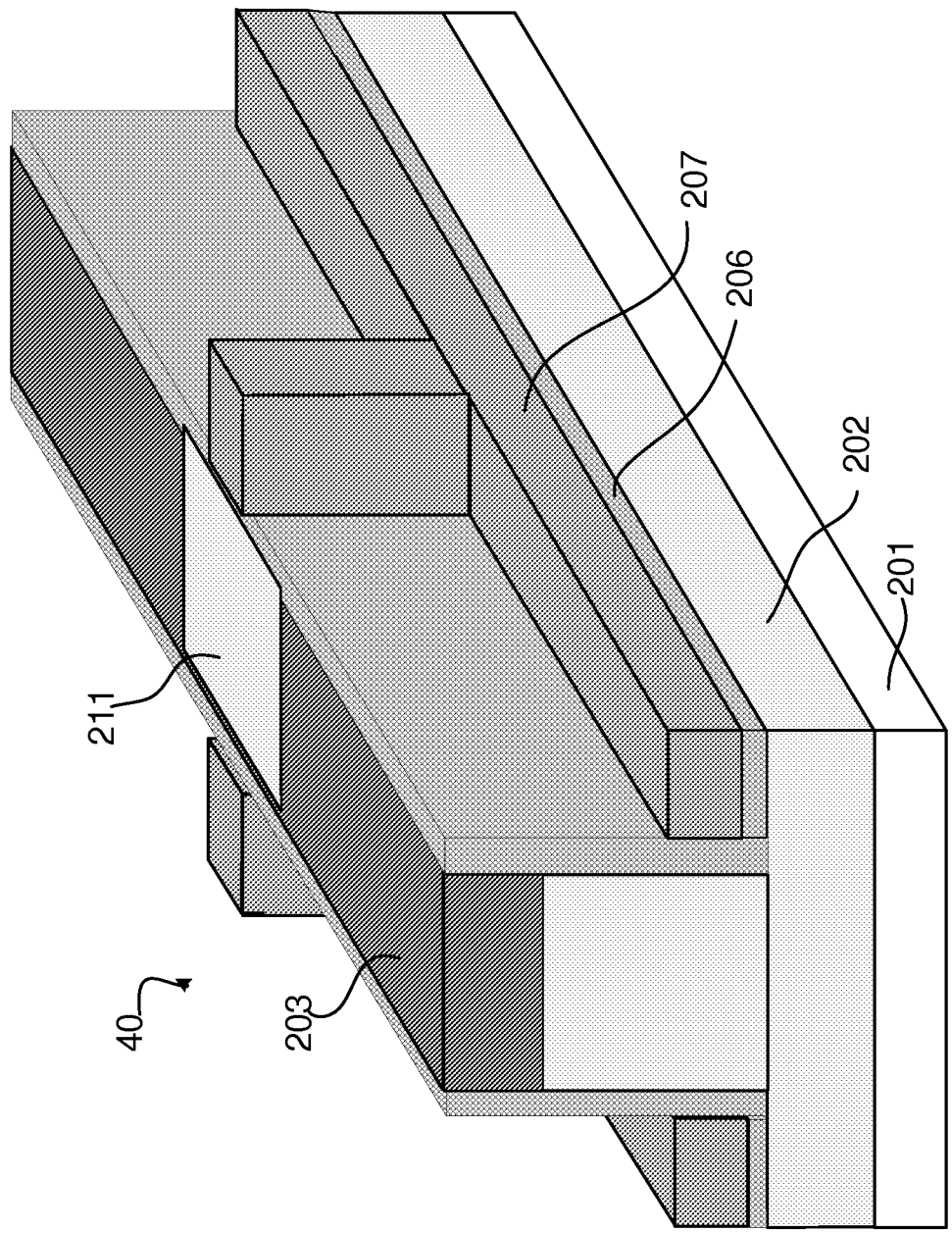

Turning to FIGS. 9C-9D, shield electrodes 207 are then formed in trenches 205. In one embodiment, firstly, a first gate material layer which may comprise poly-silicon or other suitable material is deposited on first insulation layer 206 by low pressure chemical vapor deposition (LPCVD), atomic layer deposition (ALD) or other suitable method. The first gate material layer fully fills trenches 205. Then, a portion of the first gate material layer is removed. Wherein the thickness of the removed portions are smaller than the thickness of the first gate material layer and larger than the thickness of P-well region 203. This portion of the first gate material layer may be removed by wet etching, dry etching, and/or other suitable method. Whereas at least another portion of first gate material layer which abuts to Schottky contact area 211 is not etched. The remained portion of first gate material layer is utilized as shield electrodes 207.

Figure 9E:
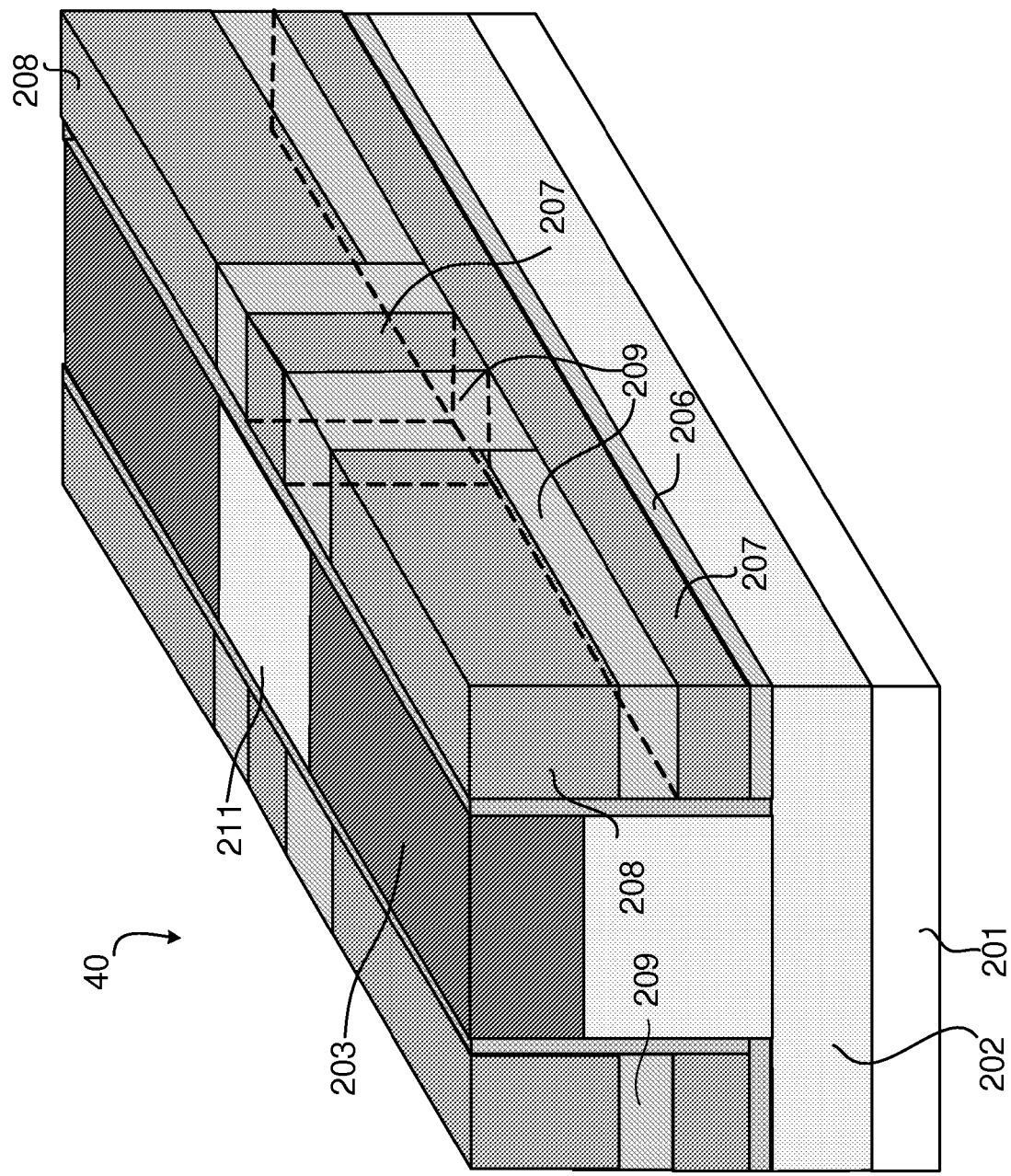

Referring to FIG. 9E, afterward, a second insulation layer 209 is further formed in trench 205 and covers the upper surface of the remained first gate material layer. Then a second gate material layer is further deposited on the second insulation layer 209 and fully fills the remained space of trench 205. The thickness of the second gate material layer is larger than P-well region 203 and thus to be utilized as gate electrodes 208. Second insulation layer 209 isolates the gate electrodes 208 and shield electrodes 207. As a result, a split trench gate structure is formed.

Figure 9F:
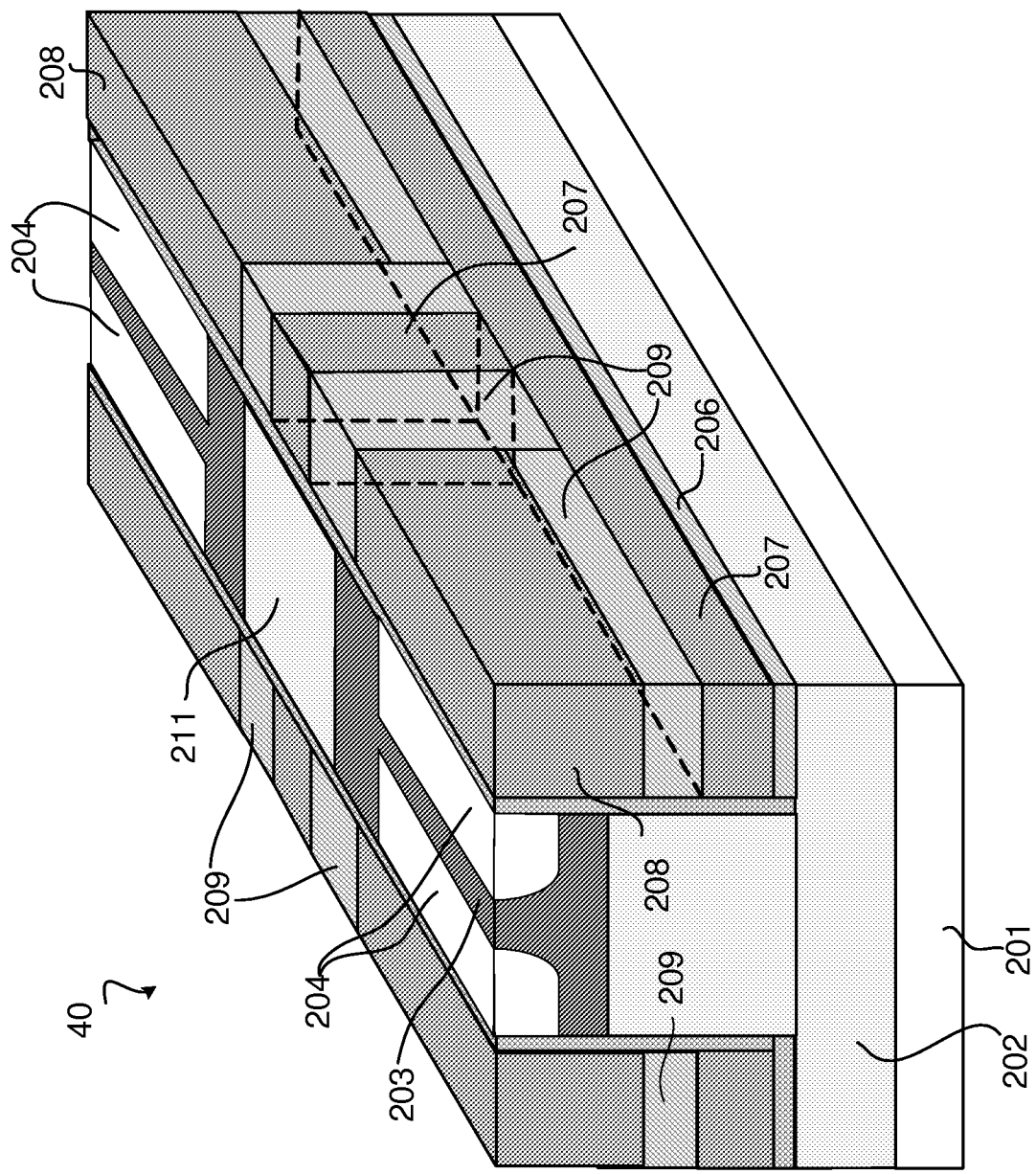

As shown in FIG. 9F, N+ source regions 204 (204A and 204B) are then formed in P-well regions 203. In one embodiment, a portion of each of P-well regions 203 may be masked. Through another self-align implantation, N+ source regions 204 may be formed at both sides of trenches 205. However in other embodiments, N+ source regions 204 may be formed by diffusion process with mask or by any other suitable method. In yet another embodiment, an alternative process may be applied to form the source regions 204 in P-well regions 203 before trenches 205 are formed. At the moment, the top surface may comprise Schottky contact region 211 which is part of initial layer 202, P-well region 203, source region 204, shield electrode 207 and gate electrode 208.

Figure 9G:
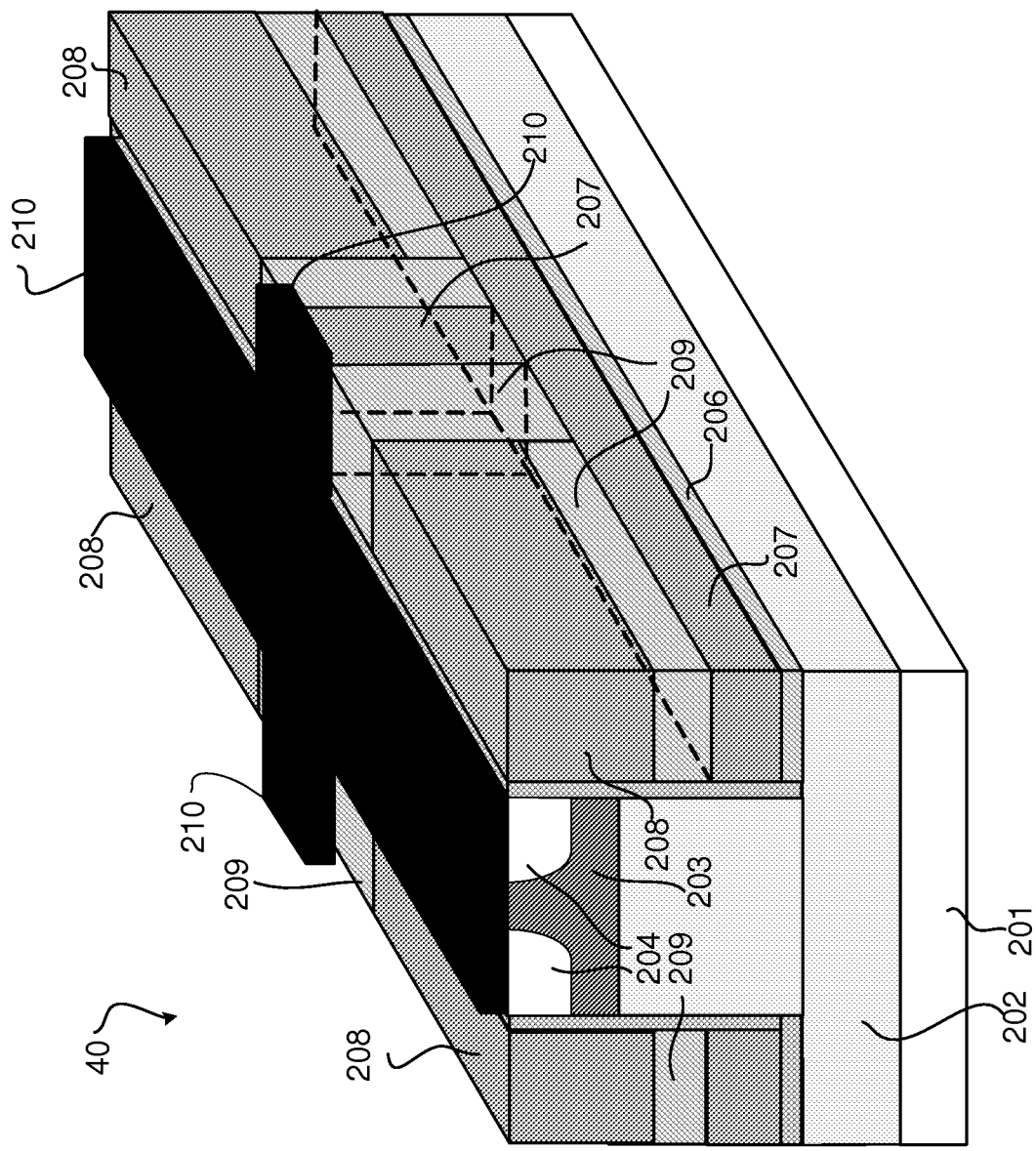

Seen in FIG. 9G, a source metal layer 210 is formed at the top surface 20A of the device. In one embodiment, source metal layer 210 may directly formed on the region of Schottky contact regions 211, P-well regions 203, source regions 204, at shield electrodes 207 at the top surface 20A without any dielectric layer. In other embodiment, a dielectric layer may be formed to cover Schottky contact regions 211, P-well regions 203, N+ source regions 204, and shield electrodes 207 at the top surface of the device firstly, and then contact vias are created in the dielectric layer. Source metal layer 210 may be formed on the dielectric layer and establish the contacts through these vias.

Figure 10:
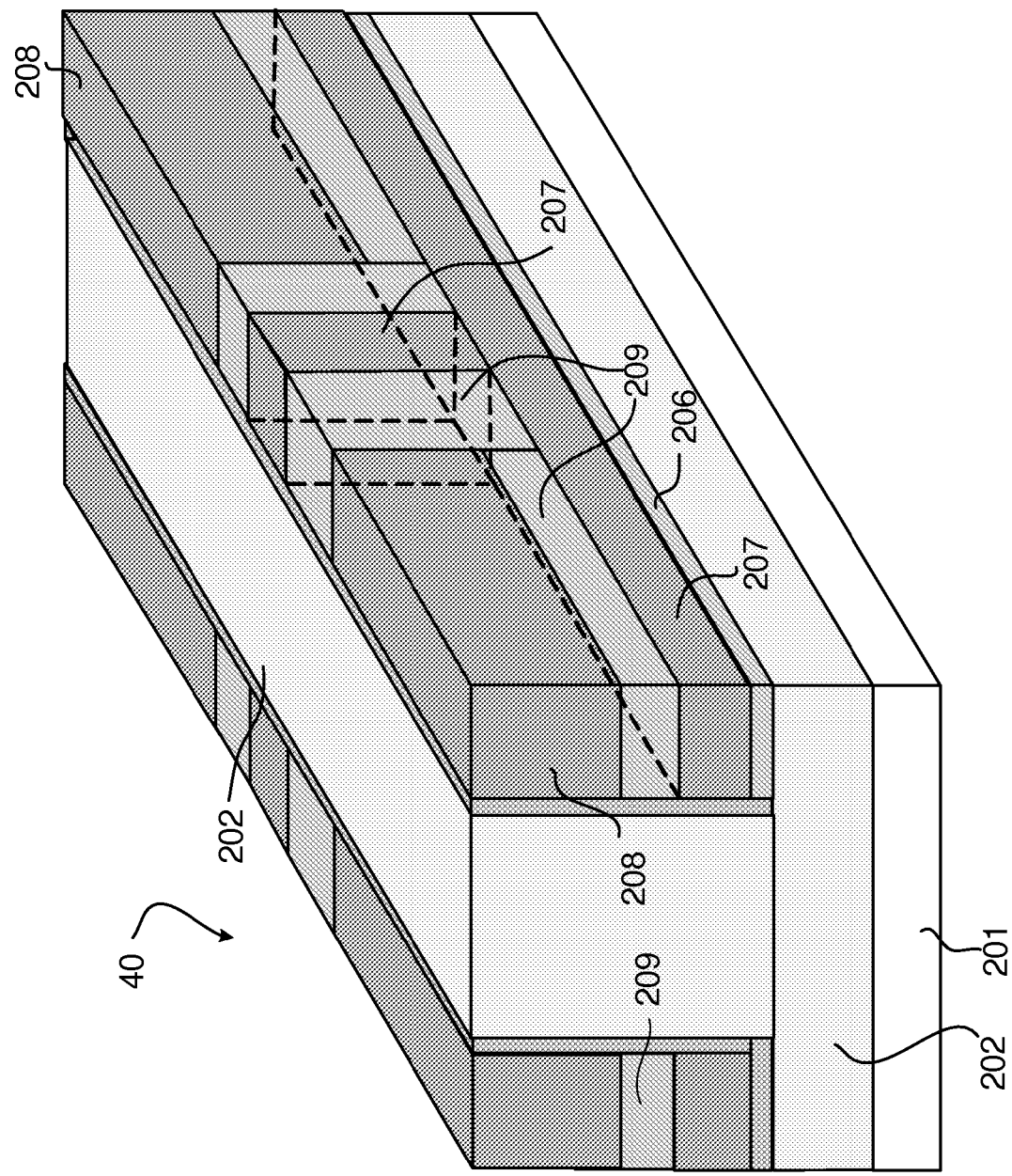
FIG. 10 illustrates a step of an alternative fabrication process flow of forming the split trench-gate MOSFET 40 according to another embodiment of the present invention.

FIG. 10 illustrates an alternative fabrication process of forming split trench-gate MOSFET 40 integrating with Schottky diode. Compared with FIGS. 9A-9G, the trench gate structures are formed in the initial layer firstly. Afterward, self-aligned ion implantation or other suitable method may be applied to form P-well regions 203. In one embodiment, a portion of each of P-well regions 203 may be further masked and another self-aligned ion implantation is applied to form the N+ source regions 204. However in other embodiment, N+ source regions 204 may be formed through diffusion.

The above description and discussion about specific embodiments of the present technology is for purposes of illustration. However, one with ordinary skill in the relevant art should know that the invention is not limited by the specific examples disclosed herein. Variations and modifications can be made on the apparatus, methods and technical design described above. Accordingly, the invention should be viewed as limited solely by the scope and spirit of the appended claims.

We claim:

1. A semiconductor device, having a top surface and a bottom surface, the semiconductor device comprising:
   a semiconductor initial layer, having a first conductivity type;
   a well region, formed in a portion of the initial layer, the well region having a second conductivity type, and the well region comprising at least two well region portions, and wherein a section of the initial layer between the well region portions extends to the top surface of the semiconductor device;
   a trench gate structure, comprising a shield electrode and two gate electrodes, wherein a substantial portion of the shield electrode is directly beneath the two gate electrodes, and wherein a section of the shield electrode between the two gate electrodes extends to the top surface;
   a source region, formed in the well region, the source region adjacent to the trench gate structure, and the source region having the first conductivity type; and
   a source metal layer, contacting the initial layer, the well region, the shield electrode and the source region at the top surface, wherein a contact between the source metal layer and the initial layer at the top surface forms a Schottky diode.

2. The semiconductor device according to claim 1, wherein the source metal layer fully contacts the section of the initial layer between the well region portions, the well region, the section of the shield electrode between the two gate electrodes, and the source region at the top surface.

3. The semiconductor device according to claim 1, wherein the trench gate structure further comprises an insulation material layer, wherein the side wall and the bottom of the trench gate structure are covered with the insulation material layer, and wherein the shield electrode and the two gate electrodes are isolated from each other by the insulation material layer.

4. The semiconductor device according to claim 1, wherein the semiconductor device comprises a continuous structure, wherein the continuous structure is duplicated along an extending orientation which is perpendicular to the trench gate structure in the horizontal plane, and wherein each of the respective trench gate structures is disposed between the corresponding two well regions along the extending orientation.

5. The semiconductor device according to claim 4, wherein each of the Schottky diodes is disposed between the corresponding two trench gate structures.

6. The semiconductor device according to claim 1, wherein the Schottky diode is disposed between the two well region portions.

7. The semiconductor device according to claim 1, wherein the well region portions abut an anode of the Schottky diode.

8. The semiconductor device according to claim 1, wherein the shield electrode and the gate electrodes comprise polysilicon.

9. The semiconductor device according to claim 1, wherein the two gates are serially arranged along with the horizontally extending direction of the trench gate structure.

10. A semiconductor device, having a top surface, comprising:
    a split trench-gate metal-oxide semiconductor field effect transistor (MOSFET), comprising a drain region, a source region, a body region, a split trench-gate structure and a source metal layer, wherein the split trench gate structure having a shield electrode and two gate electrodes, wherein a substantial portion of the shield electrode is directly beneath the two gate electrodes, and wherein a section of the shield electrode between the two gate electrodes extends to the top surface of the device, and wherein the source metal layer contacts the source region, the body region and the shield electrode at the top surface; and
    a Schottky diode, formed next to the trench-gate MOSFET, wherein an anode of the Schottky diode is comprised by a portion of the source metal layer.

11. The semiconductor device according to claim 10, having a continuous structure, wherein the continuous structure is duplicated along an extending orientation, wherein the extending orientation is perpendicular to the split trench gate structure in horizontal plane, and wherein each of the split trench gate structure is disposed between two adjacent well regions along the extending orientation.

12. The semiconductor device according to claim 11, wherein the body region comprises two body region portions, wherein the Schottky diode is disposed between two body region portions perpendicular to the extending orientation in horizontal plane, and wherein the Schottky diode is between two trench gate structures along the extending orientation.

13. The semiconductor device according to claim 12, wherein the trench gate structure further comprises an insulation material layer, wherein the side wall and the bottom of the split trench-gate structure are covered with the insulation material layer, and wherein the shield electrode and the two gate electrodes are isolated from each other by the insulation material layer.

14. The semiconductor device according to claim 10, wherein the two gates are serially arranged along with the horizontally extending direction of the split trench gate structure.

15. A method of forming a semiconductor device, comprising:
    forming a semiconductor initial layer, wherein the initial layer having a first conductivity type and having a top side and a bottom side, and wherein the top side serves as a top surface of the device, and the bottom side side serves as a bottom surface of the device;
    forming a well region comprising at least two well region portions in the semiconductor initial layer, wherein a portion of the semiconductor initial layer is between the well region portions at the top surface;

forming a trench gate structure which stretches through the well region and into the semiconductor initial layer, wherein the trench gate structure has a shield electrode and two gate electrodes, wherein a substantial portion of the shield electrode is directly beneath the gate electrodes, and wherein the other portion of the shield electrode extends to the top surface of the device between the two gate electrodes;

forming a source region in the well region proximate the trench gate structure; and forming a source metal layer contacting the initial layer, the well region, the source region and the shield electrode at the top surface wherein forming the contact between the source metal layer and the initial layer forms a Schottky diode.

16. The method of forming a semiconductor device according to claim 15, wherein forming a trench gate structure comprises:

forming a trench;

forming a first insulation layer on the bottom and the side wall of the trench;

forming a shield electrode layer on the first insulation layer;

removing a portion of the shield electrode layer from the top surface to form a shield electrode, wherein the thickness of the removed area is smaller than the thickness of the shield electrode layer and larger than the thickness of the well regions;

forming a second insulation layer on the shield electrode; and forming two gate electrodes on the second insulation layer.

17. The method of forming a semiconductor device according to claim 15, wherein forming the well regions is after forming the trench gate structure.

18. The method of forming a semiconductor device according to claim 17, wherein forming the source regions is through self-align implantation after forming the trench gate structure.

19. The method of forming a semiconductor device according to claim 15, wherein forming the well regions is through self-align implantation after forming the trench gate structure.

20. The method of forming semiconductor device according to claim 15, wherein forming the source metal layer comprises forming a metal layer fully contacting the initial layer, the well region, the source region and the shield electrode at the top surface of the device.

21. The method of forming a semiconductor device according to claim 15, wherein forming a source metal layer comprises:

forming a dielectric layer on the initial layer, the well region, the source region and the shield electrode at the top surface;

creating vias on the dielectric layer; and forming a metal layer on the dielectric layer, wherein the metal layer is connected to the initial layer, the well region, the source region and the shield electrode through the vias.

22. The method of forming a semiconductor device according to claim 15, wherein forming the well region comprises forming a well region abutting an anode of the Schottky diode.

* * * * *